United States Patent [19]

Higgins, III et al.

[11] Patent Number: 5,343,074
[45] Date of Patent: Aug. 30, 1994

[54] SEMICONDUCTOR DEVICE HAVING VOLTAGE DISTRIBUTION RING(S) AND METHOD FOR MAKING THE SAME

[75] Inventors: Leo M. Higgins, III; Aubrey K. Sparkman, both of Austin, Tex.

[73] Assignee: Motorola, Inc., Schaumburg, Ill.

[21] Appl. No.: 131,167

[22] Filed: Oct. 4, 1993

[51] Int. Cl.$^5$ .................. H01L 23/48; H01L 21/60
[52] U.S. Cl. .................. 257/668; 257/666; 437/209; 437/217; 437/220
[58] Field of Search ............ 257/666, 668; 437/209, 437/217, 220

[56] References Cited

U.S. PATENT DOCUMENTS

| | | | |
|---|---|---|---|
| 4,714,952 | 12/1987 | Takekawa et al. | 357/75 |
| 4,891,687 | 1/1990 | Mallik et al. | 357/70 |
| 5,028,983 | 7/1991 | Bickford et al. | 357/69 |
| 5,036,380 | 7/1991 | Chase | 357/70 |
| 5,068,708 | 11/1991 | Newman | 357/68 |
| 5,089,878 | 2/1992 | Lee | 357/71 |
| 5,142,351 | 8/1992 | Matta | 357/70 |
| 5,182,631 | 1/1993 | Tomimuro et al. | 257/664 |
| 5,206,536 | 4/1993 | Lim | 257/668 |
| 5,208,188 | 5/1993 | Newman | 437/220 |
| 5,212,402 | 5/1993 | Higgins, III | 257/532 |
| 5,214,845 | 6/1993 | King et al. | 29/841 |
| 5,220,195 | 6/1993 | McShane et al. | 257/666 |
| 5,221,858 | 6/1993 | Higgins, III | 257/666 |
| 5,227,662 | 7/1993 | Ohno et al. | 257/676 |
| 5,235,207 | 8/1993 | Ohi et al. | 257/670 |
| 5,235,209 | 8/1993 | Shimizu et al. | 257/692 |
| 5,237,202 | 8/1993 | Shimizu et al. | 257/672 |
| 5,250,844 | 10/1993 | Smith | 257/695 |

*Primary Examiner*—Edward Wojciechowicz
*Attorney, Agent, or Firm*—Patricia S. Goddard

[57] ABSTRACT

A semiconductor device (10) includes a voltage distribution ring (20) attached to a plurality of leads (16). The ring is made up of an insulating layer (24), preferably polyimide, and a metal layer (22), preferably gold-plated copper foil. The ring may also include intervening adhesive layers (not illustrated). The ring surrounds a semiconductor die (12) and is electrically coupled to bond pads (14) of the die by wire bond (18). In various embodiment of the invention, the ring may be segmented to distribute two different voltages, such as power and ground; the ring may include slots to expose underlying portions of the leads; and the ring may be attached to either the top surface or bottom surface of the leads.

27 Claims, 5 Drawing Sheets

SEMICONDUCTOR DEVICE HAVING VOLTAGE DISTRIBUTION RING(S) AND METHOD FOR MAKING THE SAME

FIELD OF THE INVENTION

The present invention relates to semiconductor devices in general, and more specifically to semiconductor devices having one or more voltage distribution rings. The invention also relates to methods for making such devices.

BACKGROUND OF THE INVENTION

High performance semiconductors devices are often packaged in expensive ceramic or metal packages for enhanced electrical performance. The use of such packages by a semiconductor manufacturer becomes cost prohibitive as the selling price of the device is driven down. Manufacturers would like to assemble high performance packages in less expensive plastic packages. However, large pin-counts typically associated with high performance devices are not easy to accommodate in a plastic package. Use of conventional single layer metal lead frames in high pin-count devices creates high inductance levels in signal and power supply paths, resulting in undesirable signal noise during simultaneous signal switching. Also, to handle the large currents used in high performance devices, a single layer metal lead frame requires a larger number of power and ground leads, and thus a larger number of power and ground pads on a die, to distribute the additional current. Increasing the number of leads and number of pads opposes a goal of semiconductor manufacturers which is to minimize device size. Furthermore, fine lead pitches associated with high lead count devices dictate that leads must terminate farther away from a die, making wire bonds long. The longer the wire bond lengths, the higher the inductance levels in the device.

To overcome the inductance and noise problems of high performance devices in plastic packages, conventional metal lead frames have been modified to include multiple metal layers. Such multilayer metal lead frames typically include either a power or a ground voltage plane on which a semiconductor die is mounted. The voltage plane is usually formed from conventional lead frame materials, such as copper, a copper alloy, an iron-nickel-cobalt alloy, or an iron-nickel alloy, and is attached to a more or less standard single layer lead frame. Attachment of the voltage plane to a single layer lead frame is often accomplished by using a non-conductive adhesive tape, but may also be done by welding a portion of the plane to one or more leads of the lead frame. While a multilayer lead frame having a full voltage plane is an improvement over conventional single layer lead frames in terms of electrical performance, a disadvantage with such lead frames is that a manufacturer is typically limited to having either a full power plane or a full ground plane, but not both. Furthermore, the additional layer of the lead frame increases the cost considerably.

Another known multilayer lead frame combines a first full voltage plane with a second partial voltage plane to improve electrical performance over the one-plane multilayer lead frame design discussed above. In this device, a full voltage plane is attached to a single layer lead frame in a manner similar to that described above. In addition, an annular voltage plane is attached to the top of the full voltage plane, for instance by a non-conductive adhesive tape. A semiconductor die is positioned in the central opening of the annular plane and is attached to the full plane. Power bond pads of the die are wire bonded to one of either the annular plane or the full plane, while ground pads are wire bonded to the remaining voltage plane. A semiconductor device utilizing a multilayer lead frame with one full voltage plane and one partial voltage plane has improved electrical performance over a device having only a single voltage plane. However, the cost of such a multilayer lead frame is much higher than a single layer lead frame due to more material usage and more complex processing. These multilayer lead frames can be on the order of three times the cost of single layer metal lead frames.

One known method of achieving lower lead inductance, while also lowering cost in comparison to a multilayer metal lead frame, utilizes a single layer metal lead frame having a thin, ground plane bonded to the lead frame either below the die paddle of the lead frame or bonded to the lead frame such that the ground plane serves as the die paddle. The ground plane is made of a metal layer adhesively bonded to an insulating tape, which in turn is adhesively bonded to the lead frame. The cost reduction over multilayer lead frames is realized in part because of the ease of attaching the tape to the lead frame as opposed to attaching an additional stamped or etched metal layer to the lead frame. While use of such tape has cost benefits, performance is only marginally improved because the voltage plane is not in a direct current path from the die to the lead.

As an alternative to using stamped or etched metal lead frames, some semiconductor manufacturers have employed TAB (tape automated bonding) lead flames. TAB tape lead frames include an insulating film which serves as a support carrier for etched copper metal leads. Multilayer metal TAB lead frames have been employed to improve electrical performance, wherein one metal layer is used to form the leads and another metal layer is used to form a reference voltage plane. The two overlying metal layers, separated by the insulating film, create a microstrip configuration for controlling signal impedance. A significant drawback of TAB technology is cost. Die fabrication costs are greatly increased due to a need to "bump" the bond pads of the die (or alternatively to "bump" the TAB leads). Also, the cost of TAB tapes generally are higher than stamped and etched metal lead frames.

Each of the above methods known in the prior art addresses the problem of switching noise and inductance, but fails to address other significant problems associated with packaging high performance devices in plastic. For instance, none of the above methods resolve the problem of high lead counts in general. To achieve high performance, high numbers of leads, especially power and ground leads, are necessary. As an example, some devices require as many as one voltage lead for every three signal leads in order to achieve the performance capability of the semiconductor die. In order to get large numbers of leads into a plastic package, the leads are made very long and very narrow, due to a need to fan out the tight spacing of bond pads on a die to a much coarser lead spacing at the external lead tips for bonding to a circuit board, resulting in rather large package outlines. Besides increasing package size, another problem of long, finely spaced leads is the need to maintain co-planarity for reliable wire bonding. Such fragile leads are easily damaged and displaced during handling to the point that wire bonding to the leads is difficult. A widespread technique to alleviate the problems associated with fine leads is the use of a mechanical lead support in the form of a polyimide tape. The polyimide tape is adhesively attached to a plurality of leads in a lead frame, surrounding the die receiving area. The polyimide tape is usually bonded to the leads by the lead frame manufacturer and is left in place through encapsulation. Thus the ring is part of a final plastic packaged semiconductor device.

As demonstrated above, the prior art techniques developed to overcome the problems of inductance and noise in high performance packages have done little to reduce the overall package size or address the problem of long, finely spaced leads in plastic packages. Similarly, techniques known to address the fragility of fine-pitch leads have done nothing to combat inductance and simultaneous switching noise of high performance semiconductor devices. Accordingly, there is a need for an improved high performance plastic package having low inductance, and further for such package to be minimal in size and have a low manufacturing cost.

SUMMARY OF THE INVENTION

In one form of the present invention, a semiconductor device includes a semiconductor die having a periphery, a surface, and a plurality of bond pads on the surface. The device also has a plurality of leads which surrounds the die periphery and is electrically coupled to the plurality of bond pads. Further, the device includes a voltage distribution ring made of a polymer-based tape having a metallized surface. The voltage distribution ring is adhesively bonded to the plurality of leads, surrounding the die periphery. Also, the device has means for electrically coupling the metallized surface of the voltage distribution ring to selected bond pads of the die. Another form of the present invention is a method for making such a semiconductor device.

These and other features, and advantages, will be more clearly understood from the following detailed description taken in conjunction with the accompanying drawings. It is important to point out that the illustrations may not necessarily be drawn to scale, and that there may be other embodiments of the present invention which are not specifically illustrated. Like reference numerals used through the several views designate identical or corresponding parts. Note that while a semiconductor die is referenced continuously as "die 12" in the various embodiments, and throughout the specification, the particular bond pad configuration may not be illustrated as being identical throughout the various figures. For example, the uppermost bond pad on the leftmost side of the die may be a ground pad in one illustration and a signal pad in another. These differences merely indicate the present invention is not restricted to particular bond pad and wire bond configurations, and in no way define the scope of the invention.

DETAILED DESCRIPTION OF A PREFERRED EMBODIMENT

Figure 1:
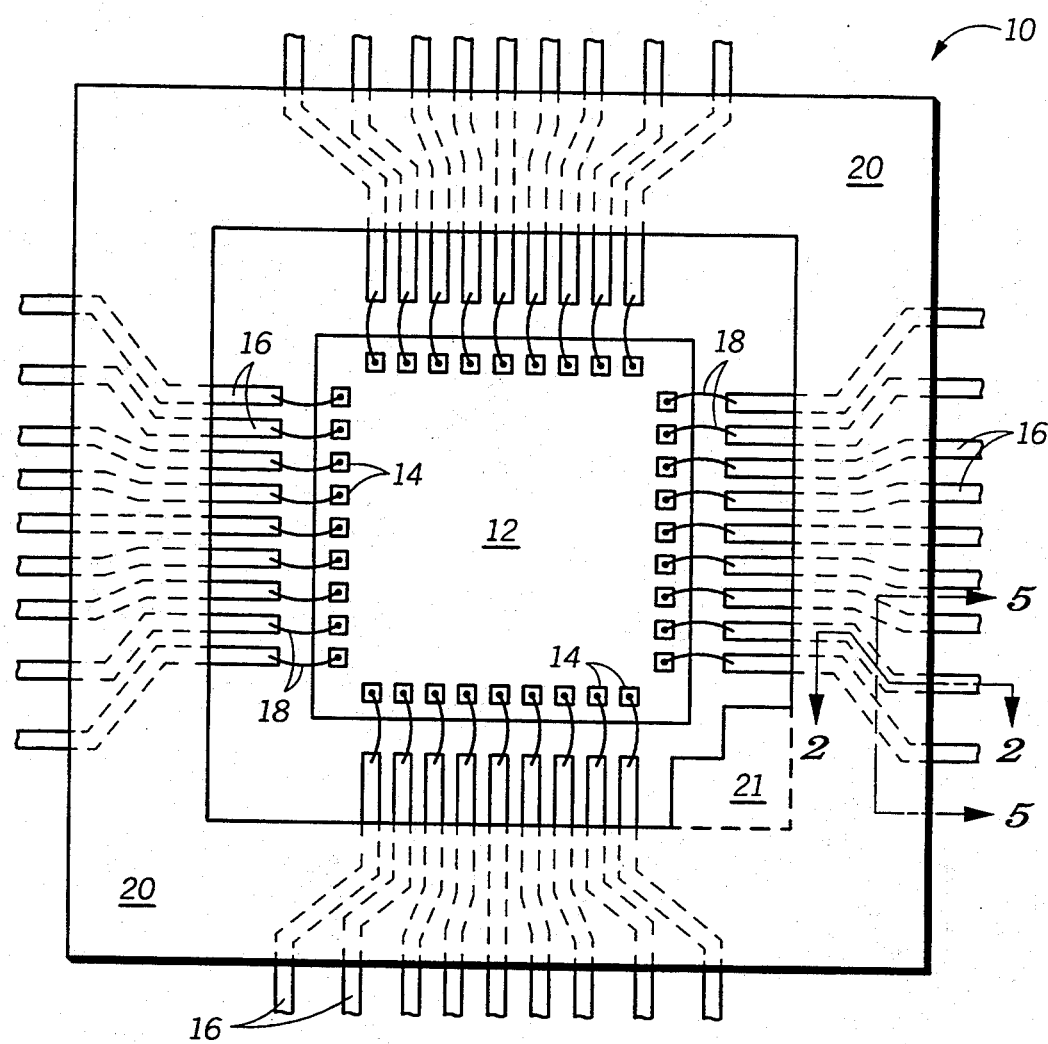
FIG. 1 is a top view of a semiconductor device having a voltage distribution ring in accordance with the present invention.

FIG. 1 illustrates a semiconductor device 10 in accordance with one embodiment of the present invention. Device 10 includes a semiconductor die 12 having a plurality of bond pads 14 formed on an active surface and located near the die periphery. Die 12 is typically an integrated circuit, such as a microcontroller, microprocessor, digital signal processor, or the like. While in preferred embodiments, die 12 is a high performance circuit, such as a circuit which operates at 25 MHz or higher or a circuit operating in a system in which electrical performance of the device is critical to the overall system performance, the present invention is not limited to the functional type, speed, or size of die 12. Surrounding die 12 is a plurality of leads 16. Leads 16 are part of a conventional stamped or etched single layer metal lead frame (not fully illustrated), usually being made of copper, a copper alloy, an iron-nickel alloy, or an iron-nickel-cobalt alloy. One of ordinary skill in the art will appreciate that other metals known, or to be developed, for use as single metal layer lead frames are also suitable for use with the present invention. Leads 16 are electrically coupled to corresponding bond pads on die 12 by a plurality of wire bonds 18.

Overlying leads 16 and surrounding die 12 is a voltage distribution ring 20. Ring 20 is an insulative tape having a metallized surface. The insulative material of ring 20 is preferably a polyimide, such as Kapton (a registered trademark of E. I. dupont de Nemours & Co.), or other polymer sheet material. In one embodiment, the base insulating material is on the order of 2 mils (0.05 mm). A metallized surface, preferably a copper foil or gold-plated copper foil, is adhesive bonded to, or otherwise formed on, a surface of the insulative material. In one embodiment, the metallization layer is on the order of 1.4 mils (0.04 mm). Processes used to form a suitable metallization layer on an insulative tape exists in other areas of semiconductor manufacturing. For example, similar processes are used in the manufacture of metallized TAB (tape automated bonding) tape. Upon formation of the ring using conventional etching and lithography processes, the ring is adhesively bonded to the plurality of leads such that the insulative portion of the ring is adjacent the leads, leaving the metallized surface fully exposed.

In prior art devices, a polyimide ring has been used to mechanically support a plurality of leads in a lead frame or around a die. As lead pitches became smaller and lead lengths became longer, it became more difficult to maintain co-planarity of the leads. A resolution to the co-planarity problem was to support the leads with a polyimide ring adhesively bonded to the leads. In existing devices, the support ring is usually bonded to the leads by the lead frame manufacturer and is left in place through encapsulation. Thus the ring is part of a final plastic packaged semiconductor device.

The present invention takes advantage of the existing technology in polyimide support rings by modifying the ring to also serve as a voltage distribution ring. Whereas a polyimide support ring in the prior art was used for mechanical lead support, a polyimide ring in accordance with the present invention can be used to serve both as mechanical lead support, but also enhance electrical device performance. In order to work as a voltage distribution ring, the polyimide-based ring is covered with a metallized surface, preferably copper. In creating a ring for use in accordance with one embodiment of the present invention, no additional etching or masking steps are necessary since the metal layer and polyimide layer are entirely coincident. Thus the only additional step needed to make the ring is deposition or formation of the metal on the polyimide, and perhaps application of an adhesive to bond the metal to the polyimide.

A ring used as a voltage distribution ring in accordance with the present invention is preferably wider than the width of existing polyimide support rings used to provide more distribution area. Prior art polyimide rings used for mechanical lead support are typically on the order of 0.5-2.0 mm (20-80 mils) wide whereas the width of a voltage distribution ring in accordance with the present invention is on the order of 1-25 mm (40-1000 mils) wide. In theory, the voltage distribution ring should be as wide as possible within the device, but practically the ring width is limited by the dimensions of the final device package and by the need to make electrical connections between the die, the leads, and the ring. To increase the area of distribution area of ring 20, the ring can be designed to occupy most of the space surrounding the die. For example in FIG. 1, ring 20 includes a portion 21 which fills in an otherwise unoccupied corner region.

As illustrated in FIG. 1, leads 16 and die 12 are not shown as being electrically coupled to ring 20, although some sort of electrical connection is needed between designated voltage leads and the ring to enable voltage distribution. FIGS. 2-5 illustrate various ways leads can be coupled to the ring in accordance with one embodiment of the present invention. Other figures throughout the detailed description demonstrate direct coupling of the die to ring.

Figure 2:
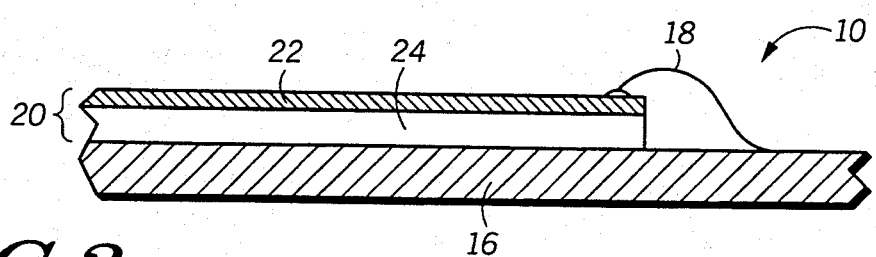
FIG. 2 is a cross-sectional view of the device of FIG. 1 taken along the line 2—2.
Figure 3:
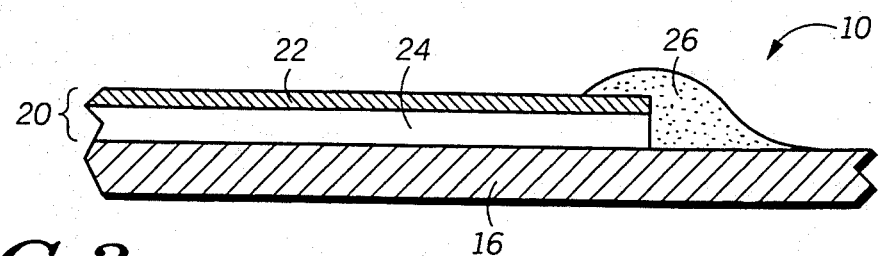
FIG. 3 is the same cross-sectional view of the device as in FIG. 2, but with an alternative means for electrical coupling.

FIG. 2 is a cross-sectional view of device 10 taken along the line 2—2. As illustrated in FIG. 2, ring 20 has a metal layer 22 and an underlying insulating layer 24. In addition, ring 20 may have intervening adhesive or binder layers not shown, for example an adhesive layer between layer 22 and 24 to bond the metal to the insulator and an adhesive layer between the insulator and leads 16. As illustrated in FIG. 2, one means of electrically coupling ring 20 to a lead is by a wire bond 18. FIG. 3 illustrates an alternative coupling means, namely a conductive polymer or conductive paste 26 which is dispensed over an edge of the ring. Suitable conductive pastes include silver filled epoxy, epoxy filled with metal coated glass spheres, silver filled polyimide, silver filled silicone, and the like. Preferably such paste would be screen printed or otherwise dispensed by the lead frame manufacturer.

Figure 4:
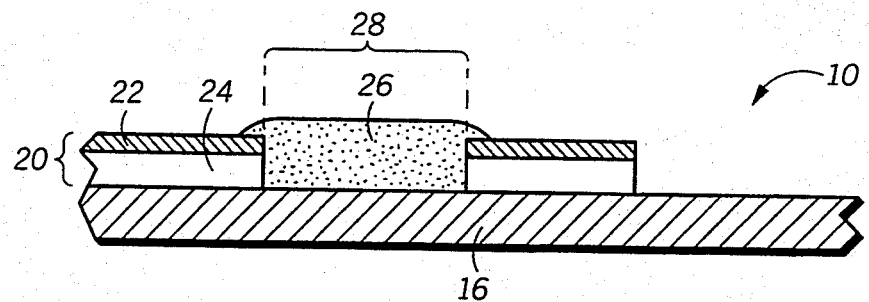
FIG. 4 is also the same cross-sectional view as in FIG. 2 with yet another means for electrical coupling.
Figure 5:
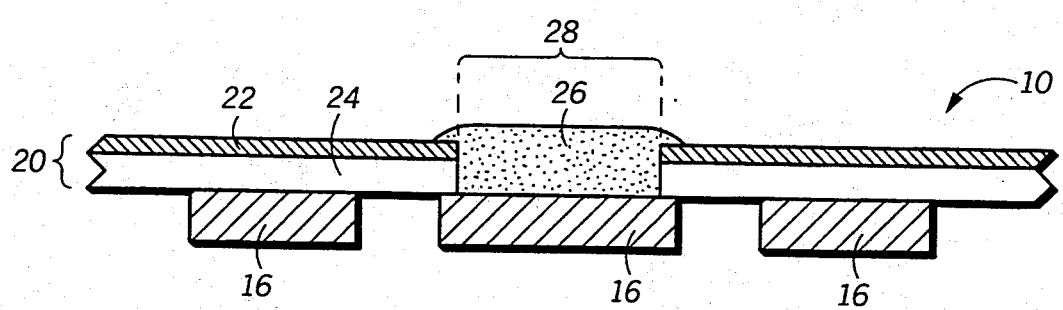
FIG. 5 is a cross-sectional view of the device of FIG. 1 taken along the line 5—5, using the electrical coupling means illustrated in FIG. 4.

Voltage distribution may be improved in devices in accordance with the present invention by providing a larger number of connections between the die and the voltage distribution ring. Improvement may also be achieved by increasing the surface and cross-sectional areas of individual electrical connections between the ring and the leads. FIGS. 4 and 5 illustrate a means for electrically coupling the ring to a lead having a large contact area. The larger contact area reduces contact resistance, and provides for lower inductance than if connection is made with a wire bond. FIG. 4 is a cross-sectional view taken along the line 2—2 of FIG. 1 while FIG. 5 is a cross-sectional view taken along the line 5—5 of FIG. 1. An opening 28 is provided in ring 20 which exposes an underlying lead. The opening can be designed to maximize the area of the exposed lead such that a conductive polymer or paste 26 will fill the opening and provide a contact area larger than contact areas of previously described embodiments. Creation of opening 28 can be accomplished using conventional stamping or etching techniques used in the manufacture of TAB (tape-automated bonding) polyimide tapes and the like. The addition of an opening 28 adds no additional cost to the ring because the opening can be formed at the same time the ring itself is stamped or etched. Lead frame cost will likely be increased, however, if a lead frame manufacturer is required to dispense paste or make other electrical connections between the ring and leads.

Figure 6:
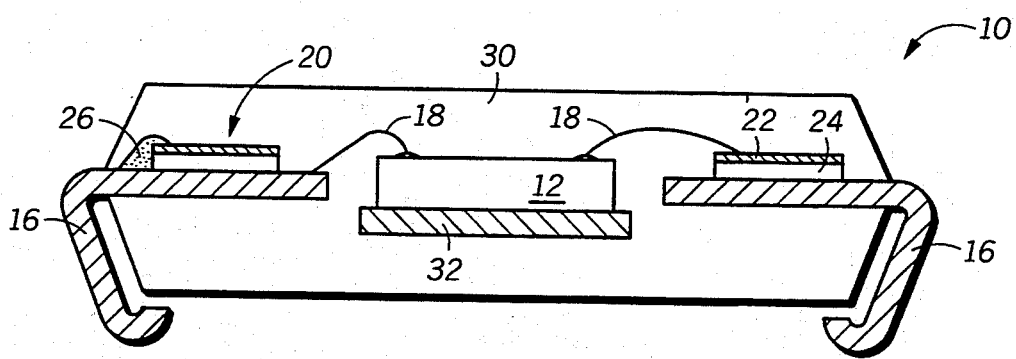
FIG. 6 is a cross-sectional view of a device in accordance with the present invention as encapsulated in a resin package body.

FIG. 6 is a cross-sectional view illustrating device 10 in its final form, as encapsulated in a plastic resin package body 30. As illustrated in FIG. 6, die 12 is supported by a conventional metal pad 32, also known as a flag or paddle, which is part of the single metal layer lead frame (not fully illustrated) having leads 16. FIG. 6 also demonstrates that a wire bond can be used to directly couple die 12 to metal layer 22 of ring 20, or connection to the ring can be accomplished by a wire bond to a lead which is in turn coupled to the ring by conductive paste 26, or by an another wire bond. After the electrical connections are made between the die, the leads, and the voltage distribution ring, the die, flag, ring, and inner portions of the leads are encapsulated in a plastic resin package body 30 by a traditional transfer molding operation. After molding, leads 16 are formed into a desired lead configuration, such as a gull-wing, a J-lead, or a through-hole configuration.

Figure 7:
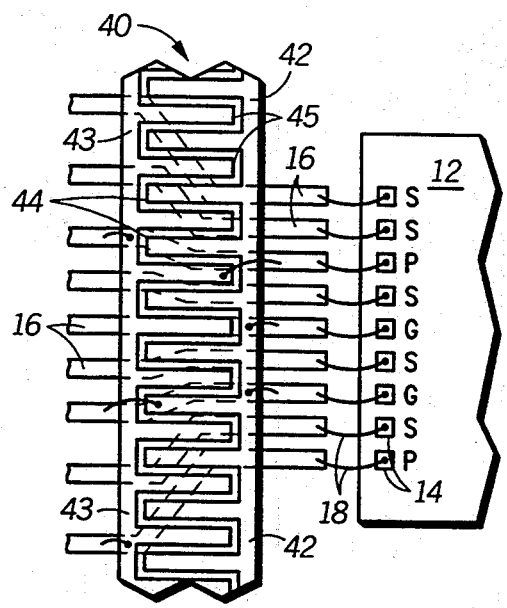
FIG. 7 illustrates, in a partial top view, use of a voltage distribution ring having two metallized segments, in accordance with another embodiment of the present invention.

FIG. 7 illustrates, in a top view, a portion of a voltage distribution ring 40 overlying and adhesively bonded to a plurality of leads 16. In accordance with an embodiment of the present invention, the exposed metallized surface of ring 40 is divided into two electrically independent segments 42 and 43. Thus, a voltage ring in accordance with the present invention can serve as two or more voltage reference planes, for example as both power and ground planes. Segment 42 and 43 each have a plurality of fingers, 44 and 45 respectively, resulting in a comb-like configuration for each segment. The fingers of each segment are interdigitated with one another. Both segments are supported by a continuous underlying insulting layer, for example a polyimide. Because the insulating layer is continuous, no portions of the leads beneath the ring are exposed, thus these portions are illustrated as hidden. As will become evident in subsequently described embodiments, a portion of the insulating layer may be removed to intentionally expose underlying leads.

Segments 42 and 43 are electrically coupled to appropriate leads 16 and the leads are electrically coupled to corresponding bonds pads 14 of the semiconductor die 12 by wire bonds 18. In a preferred embodiment, segment 42, being closer to die 12, is used as a ground distribution bus while segment 43 serves as power distribution bus. Bond pads 14 are labeled "S" for signal bonds pads, "G" for ground bond pads, and "P" for power bond pads. The ground bond pads are wire bonded to appropriate leads, which are in turn wire bonded to segment 42. The power bond pads are wire bonded to appropriate leads, which are in turn wire bonded to segment 43. Alternatively, the ground bond pads and power bond pads could be directly wire bonded to segments 42 and 43, respectively. For the purposes of reduced inductance, it is however desirable to minimize wire bond length. As illustrated in FIG. 7, wire bonds 18 used to couple ground and power leads to segments 42 and 43 are fully supported by underlying portions of the leads. In other words, during the wire bonding process, a wire is bonded to those portions of the segments having a lead underneath for support. Otherwise, a wire bonding tool would be bonding to an unsupported portion of ring 40, in which case the bonding force may damage the ring or the wire may not be bonded effectively. This problem may be overcome by one of several alternatives later discussed.

The use of both power and ground distribution segments, as in FIG. 7 and in subsequently described embodiments, creates a microstrip configuration for controlled signal impedance. The proximity of the power and ground segments to the signal leads provides for a controlled impedance environment wherein the inductance is reduced and signal-to-reference plane capacitance is increased. Also, segments 42 and 43 create a power-to-ground capacitance (capacitance between adjacent portions of the two segments) for locally storing charge, enabling faster switching. The comb-like configurations of segments 42 and 43 maximize the edge lengths of the segments for increased local charge storage. However, electrical performance can be improved without the comb-like configuration. For instance, two nested rings having straight internal edges can also improve electrical performance. Such a ring configuration is illustrated by ring 52 in FIG. 10.

Figure 8:
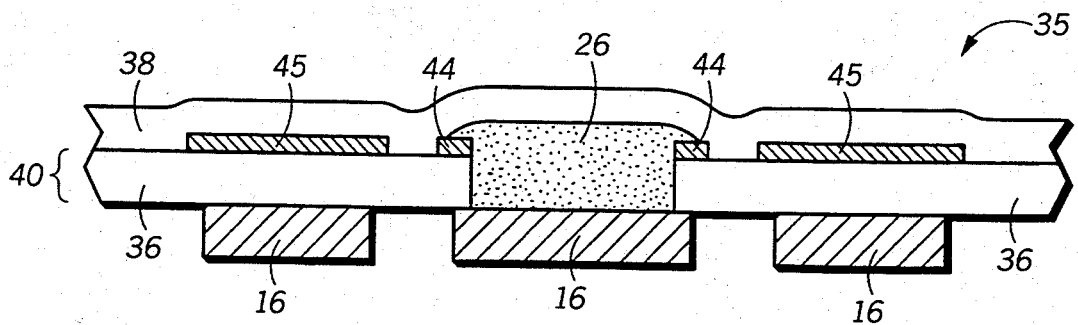
FIG. 8 is a cross-sectional view of a semiconductor device having a voltage distribution ring with an overcoat dielectric material also in accordance with the present invention.

Further enhancement of the local charge storage capability can be achieved by using a high dielectric constant overcoat material overlying the voltage distribution ring. In reference to ring 40, the space between the edges of segments 44 and 45, and coplanar with the segments, is initially filled by air. In other words, the insulating layer does not separate the edges of the two segments, only underlies the segments. Upon encapsulation, the space between segment edges is filled with a plastic resin used to form a package body. To increase capacitance between the two segments, an overcoat material having a high dielectric constant can be used. FIG. 8 illustrates in a cross-sectional view use of such an overcoat material in a semiconductor device 35 in accordance with the present invention. Device 35 includes leads 16 having overlying voltage distribution ring 40, which is the comb-like ring illustrated in FIG. 7. Fingers 44 and 45 of the ring are separated from leads 16 by an insulating layer, preferably polyimide, 36. As illustrated in FIG. 8, finger 44 is coupled to an underlying lead 16 by use of a conductive paste or epoxy 26, as previously described in reference to FIGS. 4 and 5. Overlying ring 40 is an overcoat material 38. To increase capacitance between the two segments of voltage ring 40, overcoat material 38 is a high dielectric constant material ($\epsilon_r=20$–50), such as a barium titanate ($BaTiO_3$) particle-filled epoxy to achieve the desired dielectric property.

Figure 9:
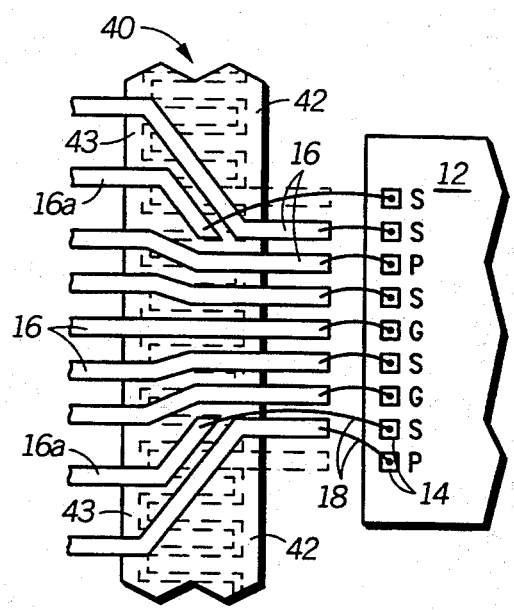
FIG. 9 is a bottom partial view of the voltage distribution ring of FIG. 7, demonstrating another feature of the present invention which permits selected leads to be shorter than others.

FIG. 9 is a view similar to that of FIG. 7, illustrating the same distribution ring 40 having metallized segments 42 and 43, but illustrating different leads than shown in FIG. 7. In FIG. 9, leads 16 are on top of ring 40, thus in appropriate areas the ring is shown as hidden. In the view of FIG. 9, the polyimide or insulating layer of the ring is in view while the metallized segments are beneath the polyimide and are hidden. FIG. 9 demonstrates how the present invention can reduce the number of leads needed next to the die periphery and/or enable leads to be brought closer to the die periphery. Fewer leads result in one of two possible benefits. One benefit is that fewer leads allow the leads to be brought closer to the die, thereby shortening wire bond length and lowering inductance. A second alternative benefit is a less expensive lead frame. Rather than bringing leads in closer to the die, the lead spacing can be increased which lowers the cost of lead frame manufacturing. As viewed in FIG. 9, two leads 16a are made shorter than remaining leads 16, resulting in fewer leads at the edge of die 12. The phantom leads illustrated in FIG. 9 demonstrate the number of leads which would be located at the die edge if leads 16a were no shortened. Shorter leads 16a are wire bonded to bond pads 14 as are remaining leads, only the wire bonds to shorter leads 16a will be longer. Preferably, shorter leads 16a are non-critical signal leads since the longer wire bond length will create higher inductance. However, in embodiments in which the voltage distribution ring is closer to the die periphery than the leads, to be discussed in reference to FIGS. 11–16, shorter leads 16a are preferably ground leads. Another way in which lead count can be reduced by practicing the invention is that not all bond pads of a die need to have a corresponding lead. Some pads may be bonded directly to the ring without need for additional bonding to a lead.

In the device of FIG. 9, leads 16 and 16a cannot simply be bonded down to metallized segments 42 and 43 because there is an intervening insulating layer between the leads and the metallized segments. A conductive epoxy or paste, such as that shown in FIG. 3, can be used on the edge of the ring to couple the metallized segments to neighboring leads. Alternatively, the ring can be wire bonded to the leads. In order to wire bond to the metallized segments (or use a conductive epoxy or paste in regions other than the edges of the ring), openings (not illustrated) should be provided in the insulating layer to expose portions of the metallized segments. Openings may be formed in the insulating layer using conventional etching and lithography techniques used to make the ring. Although attaching ring 40 to the underside of leads 16 as in FIG. 9 may require more intricate ring fabrication due to the need for openings in the insulating layer, a ring bonded to the underside of leads is advantageous in a wire bonding operation. As mentioned in reference to FIG. 7, to bond to a ring which overlies leads, the portion of the ring to be wire bonded should be physically supported by a lead to prevent damage to the ring and to insure reliable wire bonding. If a ring is attached to the underside of the leads, the ring will be fully supported during wire bonding by a wire bonding apparatus platform so that the ring may be reliably wire bonded on any portion of the metallized segments.

Figure 10:
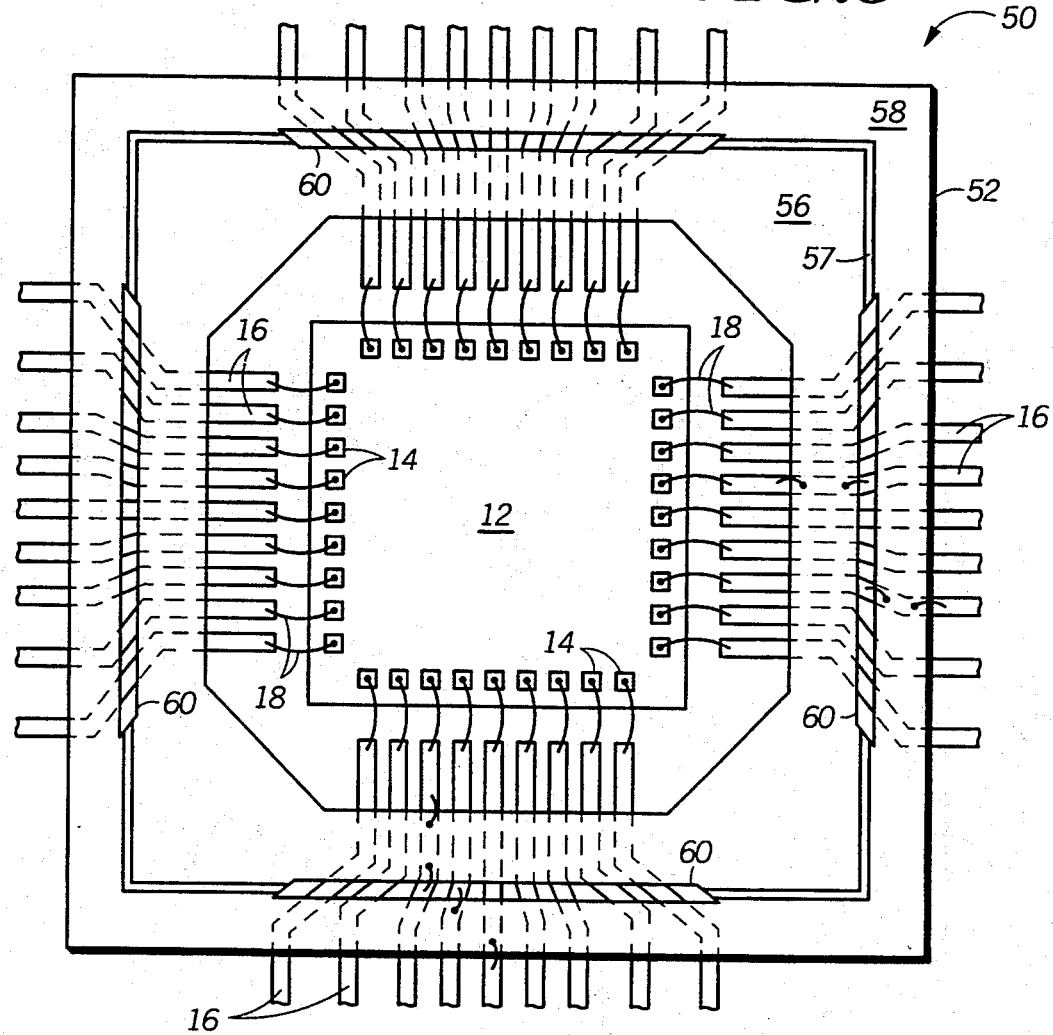
FIG. 10 is a top view of a semiconductor device, also in accordance with the present invention, in which the voltage distribution ring has two metallized segments and a slot formed in the insulating support film to exposing underlying leads.

Yet another manner for coupling a metallized surface of a voltage distribution ring to leads, in accordance with the present invention, is illustrated in FIG. 10. A semiconductor device 50 utilizes a voltage distribution ring 52 overlying a plurality of leads 16. As with previously described rings, ring 52 includes an insulating layer, preferably a polyimide, and a conductive layer, preferably copper foil or gold-plated copper foil. The insulating layer is adhesively attached to leads 16 such that the metallized surface is visible to the reader. The metallized surface is segmented into an inner ring 56 and an outer ring 58, which are separated by a space 57. Note, however, that in the view of FIG. 10, space 57 is an insulating layer of ring 52. In a preferred embodiment, inner ring 56 serves as a ground bus while outer ring 58 serves as a power bus. If additional power-to-ground capacitance is needed, inner and outer rings can be comb-like with interdigitated fingers, as later illustrated and described in reference to FIG. 11, and/or an overcoat material having a dielectric constant may be included over the ring.

Unlike previously described embodiments, ring 52 is provided with slots 60 which extend through both the metal and insulating layer to expose portions of the underlying leads. Slots 60 are used to expose the leads to provide more wire bonding options. For instance, the inner and outer rings can be wire bonded by conventional wire bonds to the portions of the leads exposed through the slots rather than only along the inner or outer periphery of the ring. Voltage distribution can be improved by using slots because the more connections made to the ring, the better the distribution. Thus, connecting a lead to the inner ring or ground bus 56 through the slot and also along the inner periphery of the ring closest to the die gives improved inductance reduction compared to making only one such connection. Also, not all pads need to be coupled first to leads and then to a voltage distribution ring. A wire bond can directly couple the die bond pad to a ring, thereby bypassing the leads. Coupling the voltage bond pads directly to a voltage ring has an advantage of eliminating the need for a dedicated lead, thereby lowering the total lead count and in turn the overall device size. The added benefit of lower lead count, in some cases, may be outweighed by the need for longer wire bonds which increase inductance levels. However, a solution to the longer wire bonds to the voltage distribution ring may be solved by bringing the ring closer to the die perimeter than the lead tips, as will be addressed in reference to FIGS. 11, 15, and 16.

Figure 11:
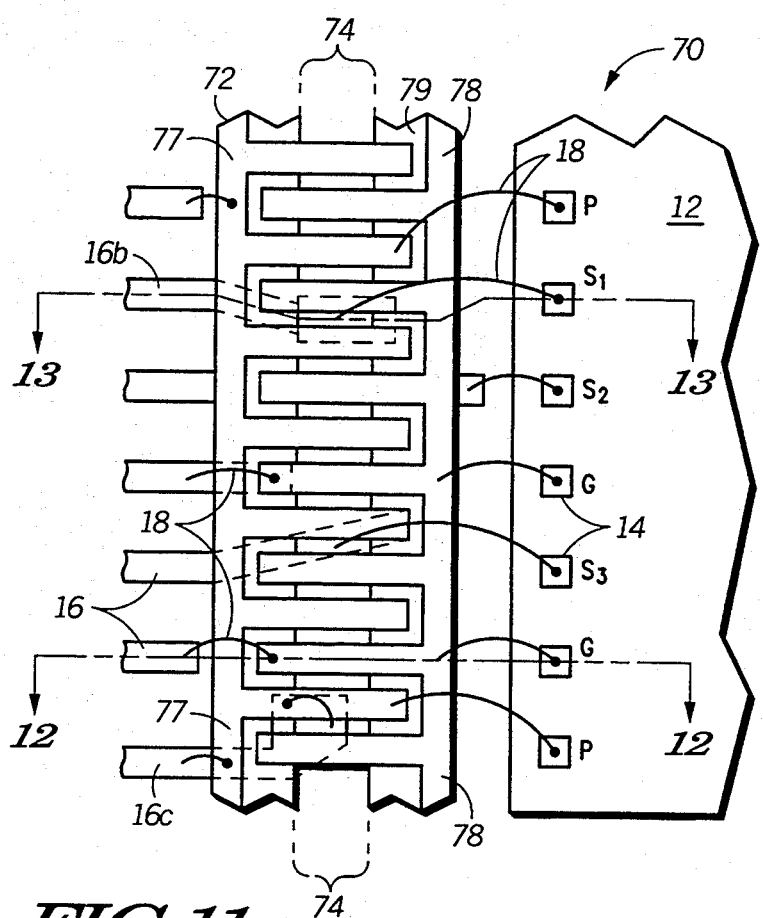
FIG. 11 illustrates, in a partial top view, a semiconductor device similar to that illustrated in FIG. 10, but that two metallized segments are interdigitated with one another.

FIG. 11 illustrates, in a partial top view, another embodiment of the present invention in which a semiconductor device 70 includes a voltage distribution ring 72 having a slot 74 which exposes underlying portions of selected leads 16. Portions of leads underlying ring 72 but not underlying slot 74 are covered by an insulative layer 79 of ring 72 and may also be covered by the metal layer of the ring. The metal layer of the ring is segmented into two electrically independent portions 77 and 78. In a preferred embodiment, the innermost portion 78 serves as a ground distribution bus, while outermost portion 77 serves as a power distribution bus.

Device 70 demonstrates a few of the numerous lead and wire bond configurations available for use with the present invention. As discussed above, use of a slot, such as slot 74, allows a wire bond to be made to lead portions underlying ring 72. Wire bonds can be made from bond pads of the die to such underlying portions, as demonstrated by wire bonds 18 which connect bond pad "$S_1$" to a lead 16b and bond pad "$S_3$" to a lead 16. Notice that lead 16b is provided with an enlarged paddle portion to provide an exposed bonding area having sufficient misalignment tolerances. However, enlarging the tip of a lead is not required when bonding through a slot in the voltage distribution ring, rather it is only a manufacturing alternative. Instead of providing an enlarged lead tip, insuring an adequate lead bonding area is exposed through the slot can be accomplished by including a dog-leg portion at the lead tip, as is done with lead 16c. Notice that the dog-leg portion can also be configured to provide support for bonding to the ring, as also illustrated in FIG. 11.

Other lead configurations suitable for use with the present invention are also included in device 70. For instance, voltage leads may be made shorter than signal leads, and in some cases need not even extend beneath voltage distribution ring 72. Thus, the voltage ring can be supported primarily, if not completely, by signal leads. Furthermore, as suggested earlier, shorter leads result in a reduction in lead count at the die edge (leading to smaller packages), or enable lead spacing to be made wider to lower cost of the lead frame. Device 70 also demonstrates that portions of the voltage distribution ring may actually be closer to the periphery of the die than the leads tips. Accordingly, wire bonds 18 to the innermost ring 78 can be made shorter than wire bonds to the leads. When the innermost ring 78 serves as a ground distribution bus, the shorter wire bonds to the ring reduce inductance compared to wire bonds made to the leads. Selected signal leads for which speed and inductance levels are critical may be extended inward beyond the voltage ring, as shown in FIG. 11 by the long lead coupled to bond pad "$S_2$".

Figure 12:
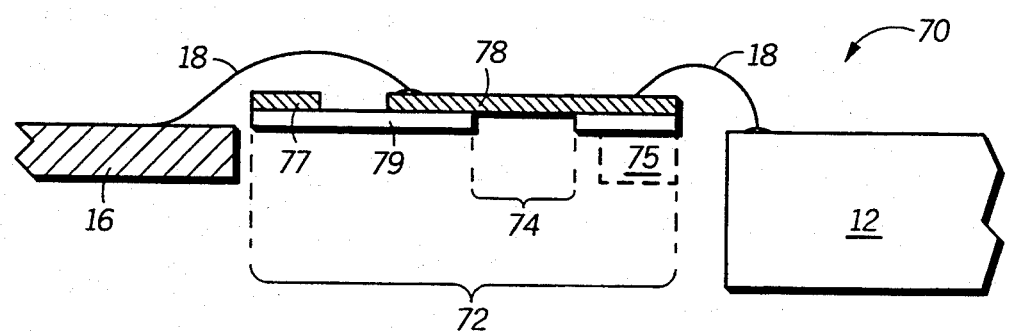
FIGS. 12-13 are cross-sectional views of the device of FIG. 11 taken along the lines 12—12 and 13—13, respectively.
Figure 13:
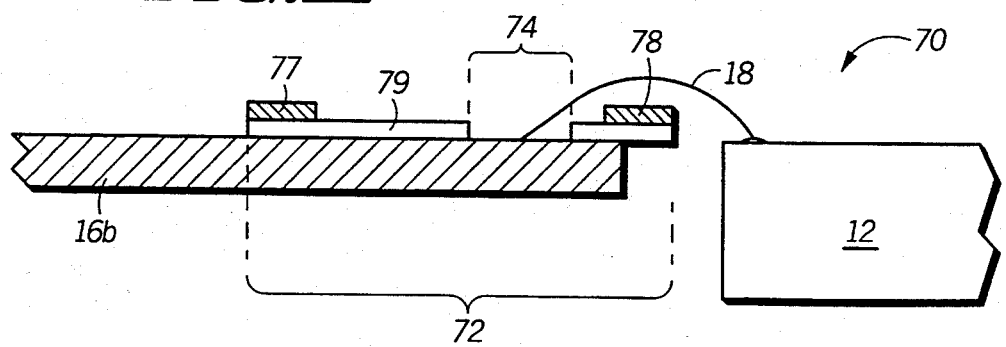

FIGS. 12 and 13 are cross-sectional views of device 70 taken along the lines 12—12 and 13—13 of FIG. 11, respectively. As FIG. 12 demonstrates, portions of voltage distribution ring 72 are unsupported by any leads. In the view of FIG. 12, lead 16 terminates at the outer periphery of ring 72, leaving portions of the ring between the leads and the die unsupported. In order to wire bond to unsupported portions of the ring, it may be necessary to provide a support member 75, illustrated in phantom, during the wire bond operation. Support member 75 may be a protrusion or an extension of a neighboring lead, or support member 75 may be incorporated into a wire bonding apparatus platform. FIG. 12 also demonstrates that in regions of ring 72 between the inner ring 78 and outer ring 77, portions of an underlying insulating layer 79 are exposed. However, the insulating layer is not present within slot 74. In other words, slot 74 is actually a slot formed in the insulating portion of the ring, but not in the metallized surface. Thus, the fingers of the metal portions 77 and 78 bridge the slot. Note, however, that in other embodiments of the present invention utilizing slots, the slots may extend entirely through both the insulating layer and metal layers, as in device 50 of FIG. 10.

In FIGS. 11-12, and in other illustrations herein, some wire bonds are coupled to a portion of the voltage distribution ring without any underlying support. It should be noted that there are at least two ways in which wire bonds to the voltage ring can successfully and reliably be made. One method is to wire bond to a portion of the ring having a lead directly underneath, in other words bonding only to those portions of the ring having lead support. Alternatively, a wire bonding tool can be designed which itself provides support for the voltage ring during the wire bonding operation. Within the same device, both approaches may be used. Moreover, it may well be possible for wire bonding to occur without support as manufacturing tools and processes are more fully developed.

Figure 14:
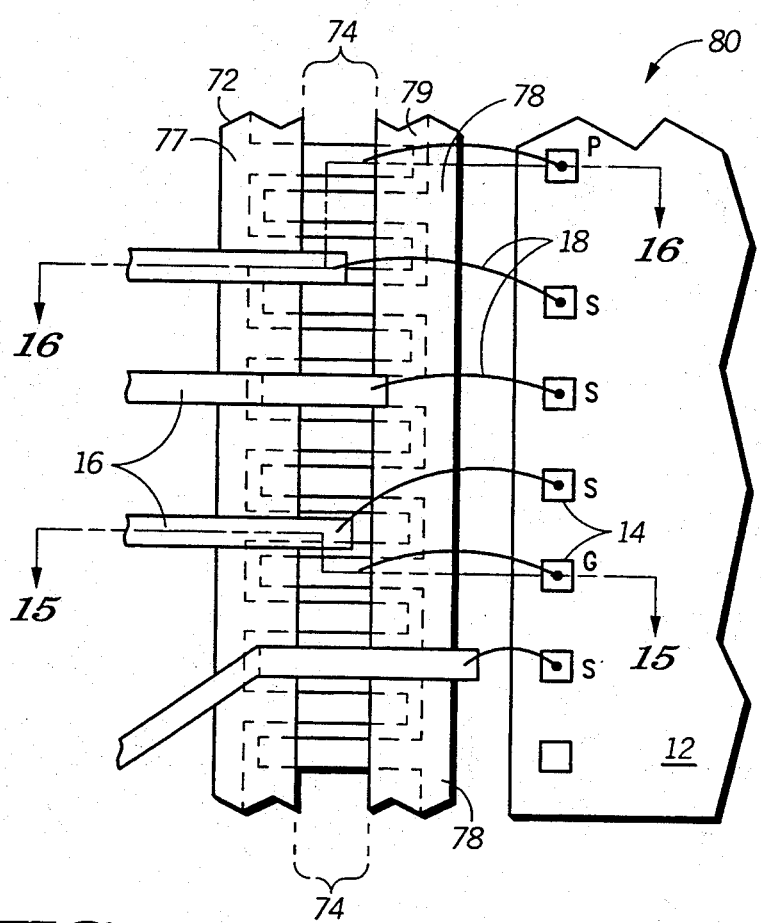
FIG. 14 is a top view of a semiconductor device, also in accordance with the present invention having the voltage distribution ring of FIG. 11 attached on the undersides of a plurality of leads which terminate at different points relative to the voltage distribution ring.

To avoid the wire bonding support issue altogether, the voltage distribution ring may be attached to the underside of the leads. FIG. 14 is a top-down view of a semiconductor device 80 in accordance with the present invention having a voltage distribution ring attached to the undersides of leads 16. Device 80 utilizes the same voltage distribution ring 72 as in FIGS. 11-13, having two comb-like, interdigitated metallized segments 77 and 78, insulating layer 79, and slotted region 74. Because the ring is attached beneath leads 16, with the insulating layer being visible to the reader, the metal segments of the ring are hidden in the view of FIG. 14 in regions other than in slot region 74. Electrical connection between bond pads 14 of die 12 and one of segments 77 or 78 is accomplished through openings in the insulating layer of the ring, such as through slot 74. Other portions of the insulating layer outside of slot 74 can be removed to expose the portion of the metal segment to be wire bonded, as explained below.

Figure 15:
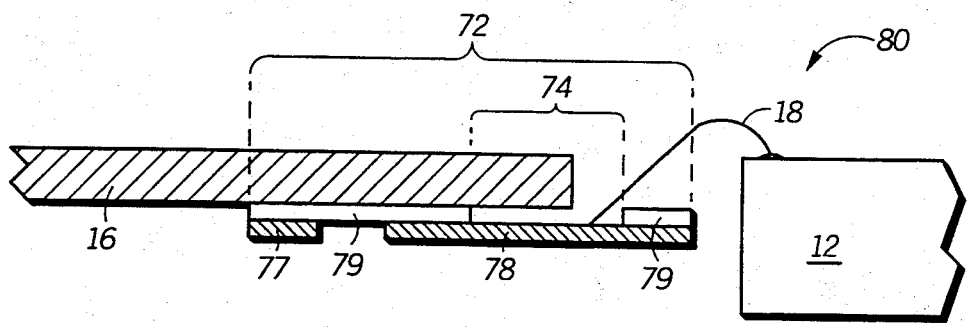
FIGS. 15-16 are cross-sectional views of the device illustrated in FIG. 14, taken along the lines 15—15 and 16—16, respectively.
Figure 16:
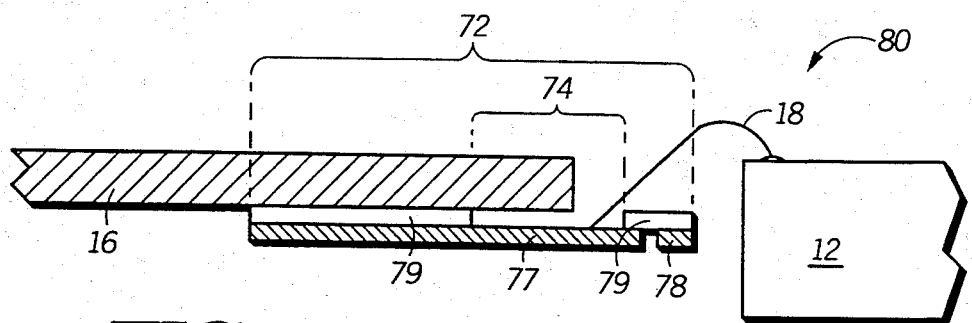

An advantage in attaching a voltage distribution ring in accordance with the present invention to the underside of the leads is that the problem of wire bonding to unsupported portions of the rings is eliminated. Upon loading device 80 into a conventional wire bonding apparatus, the entire voltage distribution ring will be supported by the apparatus platform. This is more clearly demonstrated in FIGS. 15 and 16 which are cross-sectional views of device 80 taken along the lines 15—15 and 16—16, respectively, of FIG. 14. The cross-sectional illustrations are not precisely proportioned to the top down view of FIG. 14, for example insulating layer is not symmetric about slot 74. Nonetheless, FIGS. 15 and 16 clearly demonstrate how a comb-like voltage ring in accorance with the present invention can be attached on the underside of leads. As illustrated, voltage distribution ring 72 is beneath leads 16 so that entire ring is supported upon positioning the lead frame in a wire bonding apparatus. Wire bonds can be made to inner metal segment 78, as illustrated in FIG. 15, or to finger portions of outer metal segment 77, as illustrated in FIG. 16. Note that slot region 74 is not necessarily required where the ring is bonded to undersides of the leads, provided portions of the voltage ring are exposed to permit wire bonding. For example, portions of insulating layer 79 beyond slot 74 may be removed from over segment 78 in FIGS. 15 and 16 to provide an exposed conductive area for wire bonding. Should a wire bond to the ring be desired in areas beyond the lead tips, for instance near the outer periphery of the ring, openings may be made in insulating layer 79 between adjacent leads to expose the appropriate portion of the metallized surface. Conductive epoxies or pastes may be used as an alternative to wire bonds, and may eliminate the need to form an opening in the insulating layer of the voltage distribution ring by applying the conductive material on the underside of the leads and over an edge of the ring onto the metallized segment.

The foregoing description and illustrations contained herein demonstrate many of the advantages associated with the present invention. In particular, it has been revealed that an adhesive tape having a metallized layer may serve as a voltage distribution bus. Such a tape may include one or more voltage distribution segments. In a preferred embodiment a ground segment and a power segment are both included to provide a microstrip configuration which reduces inductance, thereby reducing simultaneous switching noise in high performance integrated circuits. Use of a voltage distribution ring in accordance with the present invention permits numerous wire bond and lead configuration alternatives. For instance, leads can be made of varying lengths so that fewer leads need to be brought close to a die's peripheral bond pads. Also, leads may be coupled to voltage distribution rings in several locations for more effective voltage distribution, for example by incorporating slots or openings in the ring. Furthermore, use of a voltage distribution ring in accordance with the present invention may altogether eliminate leads, which without the ring would be necessary, by wire bonding voltage bond pads of a die only to the voltage distribution ring. As a result, a variety of die bond pad configurations could be used with the same lead configuration for a savings in design and manufacturing costs. Wire bond configurations are also numerous. A die bond pad may be wire bonded directly to the voltage distribution ring or to an appropriate lead, wherein the lead is directly coupled to the voltage distribution ring. The various wire bonding options permit more critical connections to be made of shorter wire bonds than less critical connections.

Thus it is apparent that there has been provided, in accordance with the invention, a semiconductor device having one or more voltage distribution rings, and a method for making the same, that fully meets the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, the present invention is not limited to having one or two voltage distribution segments, but may have any number of electrically independent segments. Moreover, a device in accordance with the present invention may utilize more than one tape element to provide voltage distribution. For example, a first annular tape surrounding the die, a second annular tape surrounding the first tape, etc. In addition, the invention is not limited to wire bonds as a means of coupling a voltage distribution ring to lead or a die. Conductive pastes, solder, and other conductive materials are also suitable. It is also important to note that the present invention is not limited in any way to the configuration of electrical connections between the voltage distribution ring, the leads, and the die. For example, a voltage bond pad may be electrically coupled directly to the ring, or indirectly to the ring via a lead. Furthermore, a voltage distribution ring used in accordance with the present invention is not limited to use as power and/or ground distribution, but may instead be used for any voltage distribution, such as a terminating voltage plane for emitter coupled logic (ECL). Therefore, it is intended that this invention encompass all such variations and modifications as fall within the scope of the appended claims.

What is claimed is:

1. A semiconductor device comprising:
    a semiconductor die having a periphery, a surface, and a plurality of bond pads on the surface and along the periphery;
    a single layer metal lead frame having a plurality of substantially co-planar leads offset from and surrounding the die periphery and electrically coupled to the plurality of bond pads;
    a voltage distribution ring offset from and surrounding the periphery of the die, the ring being an insulative polymer-based tape having a single metallized surface and being adhesively bonded to the plurality of leads to aid in maintaining lead planarity; and
    means for electrically coupling the metallized surface of the ring to a selected bond pad of the die.

2. The device of claim 1 wherein the means comprises a wire bond electrically coupling the selected bond pad to the metallized surface.

3. The device of claim 2 wherein a first lead lies beneath the metallized surface, such that the first lead supports the ring and the wire bond to the metallized surface.

4. The device of claim 1 further comprising means for electrically coupling the metallized surface of the ring to a selected lead of the plurality of leads.

5. The device of claim 4 wherein the means for electrically coupling the metallized surface of the ring to selected leads comprises a means selected from a group consisting of wire bonds, conductive polymers, and conductive paste.

6. The device of claim 4 wherein the means for electrically coupling the metallized surface of the ring to a selected bond pad comprises a first wire bond electrically coupling the metallized surface to the selected lead and a second wire bond electrically coupling the selected lead to the selected bond pad.

7. The device of claim 1 wherein the metallized surface is sub-divided into two annular segments.

8. The device of claim 7 wherein one segment serves as a first voltage distribution ring for use as a ground bus and the other segment serves as a second voltage distribution ring for use as a power bus.

9. The device of claim 8 wherein the segment serving as the ground bus is closer to the die periphery than the segment serving as the power bus.

10. The device of claim 7 wherein each segment has a comb-like configuration with a plurality of fingers, and wherein the fingers of the two segments are interdigitated with one another.

11. The device of claim 10 wherein one segment serves as a first voltage distribution ring for use as a ground bus and the other segment serves as a second voltage distribution ring for use as a power bus, wherein the first voltage distribution ring is closer to the die periphery than the second voltage distribution ring.

12. A semiconductor device comprising:
    a semiconductor die having a periphery and an active surface, the active surface having a plurality of signal bond pads and a plurality of voltage bond pads, both pluralities of bond pads being formed along the die periphery;
    a single layer metal lead frame comprising:
        a plurality of signal leads adjacent the periphery of the die;
        a plurality of voltage leads adjacent the periphery of the die and interspersed with the plurality of signal leads; and
        a voltage distribution ring comprised of a polyimide tape having a conductive surface on a single side of the tape, the ring being adhesively attached to the pluralities of signal and voltage leads to keep all leads substantially co-planar, and the ring surrounding and being offset from the die periphery;
    a plurality of wire bonds electrically coupling the plurality of signal leads to the plurality of signal bond pads;
    means for electrically coupling the voltage bond pads to the conductive surface of the ring; and
    means for electrically coupling the plurality of voltage leads to the conductive surface of the ring.

13. The device of claim 12 wherein the plurality of voltage leads is closer to the die periphery than the plurality of signal leads.

14. The device of claim 12 wherein the plurality of signal leads is closer to the die periphery than the plurality of voltage leads.

15. The device of claim 14 wherein a portion of the voltage distribution ring is closer to the die periphery than any lead of the plurality of signal leads.

16. The device of claim 12 wherein the polyimide tape has a slot which exposes portions of the signal leads, and wherein the exposed portions of the signal leads are wire bonded to the signal bond pads of the die.

17. The device of claim 16 wherein a portion of the voltage distribution ring is closer to the die periphery than any lead of the plurality of signal leads.

18. The device of claim 12 wherein the polyimide tape has a slot which exposes portions of the voltage leads, and wherein the exposed portions of the voltage leads are wire bonded to the conductive surface of the voltage distribution ring.

19. The device of claim 12 wherein the number of voltage bond pads on the die is greater than the number of voltage leads in the device.

20. The device of claim 12 wherein the voltage distribution ring comprises an inner ring and outer ring, wherein the inner ring is closer to the die periphery than the outer ring.

21. The device of claim 20 wherein the plurality of voltage pads comprises a plurality of ground pads and a plurality of power pads, and wherein the plurality of ground pads is electrically coupled to the inner ring and the plurality of power pads is electrically coupled to the outer ring.

22. The device of claim 20 wherein the inner ring and outer ring are interdigitated with one another.

23. A method for making a semiconductor device comprising the steps of:
providing a single layer metal lead frame having a plurality of substantially co-planar leads defining a die receiving area, and a voltage distribution ring adhesively attached to the plurality of leads to aid in maintaining lead co-planarity and encompassing the die receiving area, wherein the voltage distribution ring comprises:
a polyimide layer adjacent the leads; and
a single metal layer adjacent the polyimide layer;
providing a semiconductor die having a surface with a plurality of bond pads formed thereon and along a periphery thereof;
positioning the semiconductor die within the die receiving area such that the die is also positioned within the voltage distribution ring and is offset from the die periphery; and
electrically coupling selected bond pads of the die to the metal layer of the voltage distribution ring.

24. The method of claim 23 wherein the step of electrically coupling comprises:
wire bonding the selected bond pads to selected leads; and
wire bonding the selected leads to the metal layer of the ring.

25. The method of claim 23 wherein the step of electrically coupling comprises wire bonding the selected bond pads directly to the metal layer of the ring.

26. The device of claim 1 wherein each lead of the plurality of leads has an inner lead tip located adjacent the die periphery, and wherein the voltage distribution ring is offset from each of the inner lead tips.

27. The device of claim 12 wherein each lead of the plurality of signal leads and the plurity of voltage leads has an inner lead tip located adjacent the die periphery, and wherein the voltage distribution ring is offset from each of the inner lead tips.

* * * * *